United States Patent
Colmer et al.

(10) Patent No.: US 7,672,411 B2
(45) Date of Patent: Mar. 2, 2010

(54) RADIO RECEIVER

(76) Inventors: Morgan James Colmer, 93 Lovell Road, Cambridge (GB); Martin John Brennan, 16 Paget Place, Newmarket, Suffolk (GB)

( * ) Notice: Subject to any disclaimer, the term of this patent is extended or adjusted under 35 U.S.C. 154(b) by 1145 days.

(21) Appl. No.: 10/291,984

(22) Filed: Nov. 12, 2002

(65) Prior Publication Data

US 2004/0091062 A1 May 13, 2004

Related U.S. Application Data

(63) Continuation of application No. PCT/GB01/02107, filed on May 14, 2001.

(30) Foreign Application Priority Data

May 12, 2000 (GB) .................................. 0011540.2

(51) Int. Cl.
H04B 1/10 (2006.01)
H04B 15/00 (2006.01)
H04L 27/22 (2006.01)

(52) U.S. Cl. ...................... 375/350; 375/332; 375/346; 329/304; 381/94.1

(58) Field of Classification Search ................ 375/216, 375/268, 269, 316, 320, 321, 329, 332, 346, 375/350; 329/304, 347, 358; 381/2, 71.1, 381/4, 71.11, 99, 94.1, 102, 94.2, 103, 94.8
See application file for complete search history.

(56) References Cited

U.S. PATENT DOCUMENTS

| 4,130,806 A | 12/1978 | Van Gerwen et al. |
| 4,677,690 A | 6/1987 | Reed |
| 5,222,144 A * | 6/1993 | Whikehart .................... 381/15 |
| 5,387,913 A * | 2/1995 | Park et al. .................... 341/155 |
| 5,548,619 A | 8/1996 | Horiike et al. |
| 5,805,579 A * | 9/1998 | Erving et al. ................ 370/320 |
| 5,956,373 A * | 9/1999 | Goldston et al. ............. 375/298 |
| 6,067,329 A * | 5/2000 | Kato et al. .................... 375/321 |
| 6,370,130 B1 | 4/2002 | Zhou et al. |
| 7,254,189 B1 * | 8/2007 | Kazakevich et al. ......... 375/326 |
| 2001/0024475 A1 * | 9/2001 | Kumar ......................... 375/270 |
| 2001/0040930 A1 * | 11/2001 | Abbey .......................... 375/316 |

FOREIGN PATENT DOCUMENTS

| CN | 1202050 | 4/2002 |
| EP | 0310960 | 4/1989 |
| EP | 0335037 | 10/1989 |

(Continued)

OTHER PUBLICATIONS

Examination Report for European Application No. 01928124.5 filed May 14, 2001.

*Primary Examiner*—Young T. Tse
(74) *Attorney, Agent, or Firm*—McDonnell Boehnen Hulbert & Berghoff LLP

(57) ABSTRACT

A radio receiver comprising: an antenna for receiving a radio frequency signal amplitude modulated with an audio frequency signal; a digitizer for periodically sampling the radio frequency signal and generating a digital reception signal representative of the amplitude of the radio frequency signal; and a demodulator for demodulating the digital reception signal to generate a representation of the audio frequency signal.

40 Claims, 1 Drawing Sheet

FOREIGN PATENT DOCUMENTS

| | | |
|---|---|---|
| GB | 2176356 | 12/1986 |
| GB | 2187349 | 9/1987 |
| GB | 2231459 | 11/1990 |
| NL | 1529544 | 10/1978 |
| WO | WO 87/01531 | 3/1987 |
| WO | WO 99/30428 | 6/1999 |
| WO | WO 99/34519 | 7/1999 |
| WO | WO 00/08764 | 2/2000 |
| WO | WO 00/24125 | 4/2000 |

* cited by examiner

RADIO RECEIVER

CROSS-REFERENCE TO RELATED APPLICATIONS

This application is a continuation of International Application No. PCT/GB01/02107, having an international filing date of May 14, 2001, which itself claims priority to United Kingdom Application No. GB 0011540.2, filed May 12, 2000.

BACKGROUND OF THE INVENTION

1. Field of the Invention

This invention relates to a radio receiver, for example an amplitude modulation (AM) radio receiver for a hi-fi system or the like.

2. Description of Related Art

In a normal AM radio receiver, the received radio frequency (RF) signal is fed to a mixer where it is mixed with a local oscillator signal to downconvert it to baseband. There may be more than one mixing stage, in which case the received signal passes through one or more intermediate frequency (IF) stages. Bandpass filtering and amplification may be performed at each stage. The resulting signal is an analogue signal at audio frequency which can be amplified and fed to a loudspeaker.

In one implementation the receiver stage is implemented wholly or mostly with discrete analogue components. This occupies a considerable amount of circuit board area, and requires a complex and costly manufacturing process. In addition, diagnosing faults in the receiver is difficult because of the number of discrete analogue components. The analogue components may be integrated on to a single integrated circuit. In some specialist receiver systems, for example the Racal model 2551/2561 and the JRC model NRD 545 the received signal is converted to digital form at the intermediate frequency stage. However, the radio frequency components of this receiver are still implemented in analogue form and are subject to the disadvantages discussed above, and the complexity and expense of these systems makes them highly unsuitable for domestic AM receiver applications.

It would be desirable to be able to provide a radio receiver having reduced size, cost and complexity.

BRIEF SUMMARY OF THE INVENTION

According to one aspect of the present invention there is provided a radio receiver comprising: an antenna for receiving a radio frequency signal amplitude modulated with an audio frequency signal; a digitiser for periodically sampling the radio frequency signal and generating a digital reception signal representative of the amplitude of the radio frequency signal; and a demodulator for demodulating the digital reception signal to generate a representation of the audio frequency signal.

According to a second aspect of the present invention there is provided a radio receiver for operation in a radio system in which a plurality of radio channels are transmitted at frequencies spaced apart by a predetermined channel spacing, the receiver comprising: an antenna for receiving a radio frequency signal; a demodulator for demodulating a signal derived from the radio frequency signal to form a demodulated signal; and a filter for filtering the demodulated signal, the filter having a peak response in the region of the reception frequency and having nulls in its response in the region of frequencies spaced apart from the reception frequency by the channel spacing.

According to a third aspect of the present invention there is provided a method for cancelling a beat frequency in a radio receiver capable of receiving a radio signal, forming a first demodulated signal by mixing a signal derived from the radio signal with a first local oscillator signal, and forming a second demodulated signal by mixing a signal derived from the radio signal with a second local oscillator signal having a quadrature relationship with the first local oscillator signal, the method comprising repeatedly performing the steps of: determining the modulus of the first demodulated signal; determining the modulus of the second demodulated signal; comparing the modulus of the first demodulated signal with the modulus of the second demodulated signal; determining a quotient by dividing the greater of the moduli of the first demodulated signal and the second demodulated signal by the lesser of the moduli of the first demodulated signal and the second demodulated signal; determining a cancellation factor having the value of the reciprocal of the cosine of the arctangent of the quotient; and forming a beat cancelled signal by multiplying one of the first and second demodulated signals by the cancellation factor.

The digital reception signal is preferably a single bit signal, and the digitiser is preferably a single bit digitiser. The digitiser may suitably be a sigma-delta modulator.

The demodulator preferably comprises a local oscillator for generating a first local oscillator signal at a reception frequency of the receiver; and a mixer for mixing the local oscillator with the digital reception signal to form a first demodulated signal. The first local oscillator signal may then be a single bit signal. The mixer may be implemented as an exclusive OR gate having two inputs and arranged to receive the digital reception signal at one of its inputs and the first local oscillator signal at the other of its inputs.

The radio receiver may comprise a user input device for input of a reception frequency, and a local oscillator controller responsive to the user input device for controlling the local oscillator to generate the first local oscillator signal at the input reception frequency.

The demodulator suitably comprises means for generating a second local oscillator signal at a reception frequency of the receiver and having a quadrature phase relationship with the first local oscillator signal; and a mixer for mixing the local oscillator with the digital reception signal to form a second demodulated signal. The means for generating the second local oscillator signal may be the said local oscillator. The receiver may comprise a beat cancellation device for forming a beat cancelled signal by processing the first demodulated signal and the second demodulated signal to at least partially cancel from the first demodulated signal and/or the second demodulated signal a beat frequency resulting from the mixing of the local oscillator signals with the digital reception signal. The beat cancellation device may be arranged to repeatedly perform the steps of: determining the modulus of the first demodulated signal; determining the modulus of the second demodulated signal; comparing the modulus of the first demodulated signal with the modulus of the second demodulated signal; determining a quotient by dividing the greater of the moduli of the first demodulated signal and the second demodulated signal by the lesser of the moduli of the first demodulated signal and the second demodulated signal; determining a cancellation factor having the value of the reciprocal of the cosine of the arctangent of the quotient; and forming the beat cancelled signal by multiplying one of the first and second demodulated signals by the cancellation factor.

The receiver is suitably for operation in a radio system in which a plurality of radio channels are transmitted at frequencies spaced apart by a predetermined channel spacing, and the demodulator comprises a filter arranged to filter the first demodulated signal, the filter having a peak response in the region of the reception frequency and having nulls in its response in the region of frequencies spaced apart from the reception frequency by a channel spacing. The said user input device may then be arranged for user selection of one of a plurality of reception frequencies spaced apart by the channel spacing. The digitiser can suitably be arranged to periodically sample the radio frequency signal at more than twice the reception frequency of the receiver. The channel spacing may be 8.820 kHz.

Preferably the user input device is capable of receiving input indicative of one of a plurality of selecting one of a plurality of channels and the local oscillator controller is arranged to, on the basis of the selected channel, cause the local oscillator to generate the first local oscillator signal at one of a plurality of frequencies spaced apart by the channel spacing.

The attenuation of the filter at frequencies spaced above and below the reception frequency by the channel spacing is suitably more than $10^8$ times and preferably more than $10^{11}$ times the attenuation of the filter at the reception frequency.

The filter may be a cascaded integrator comb filter and/or a third order filter.

The local oscillator signal may be formed at a sampling frequency greater than the radio frequency to be received and/or be noise shaped to improve the shape of the beat cancelled signal.

The said first and second demodulated signals may be radio frequency signals, intermediate frequency signals or baseband signals.

Where the first and second local oscillator signals are single bit signals, the said method may include the steps of forming first and second single bit demodulation signals by mixing a signal derived from the radio signal with the first and second local oscillator signals respectively, and decimating the first and second single bit demodulation signals to form the first and second demodulated signals. The first and second demodulated signals may be eight-bit signals.

The said one of the first and second demodulated signals is preferably the one of the first and second demodulated signals having the greater magnitude. The method may then include the step of determining which of the first and second demodulated signals has the greater magnitude.

The determination of the cancellation factor comprises retrieving from a stored look-up table a cancellation factor corresponding to the quotient. The method may include the step of forming the said look-up table by calculating cancellation factors for a range of quotients. The look-up table may be stored in temporary or permanent memory.

The beat cancellation device may comprise a digital processor arranged to perform a series of instructions to form the beat cancelled signal.

BRIEF DESCRIPTION OF THE DRAWINGS

The present invention will now be described by way of example with reference to the accompanying drawings, in which.

DETAILED DESCRIPTION OF THE INVENTION

Figure 1:
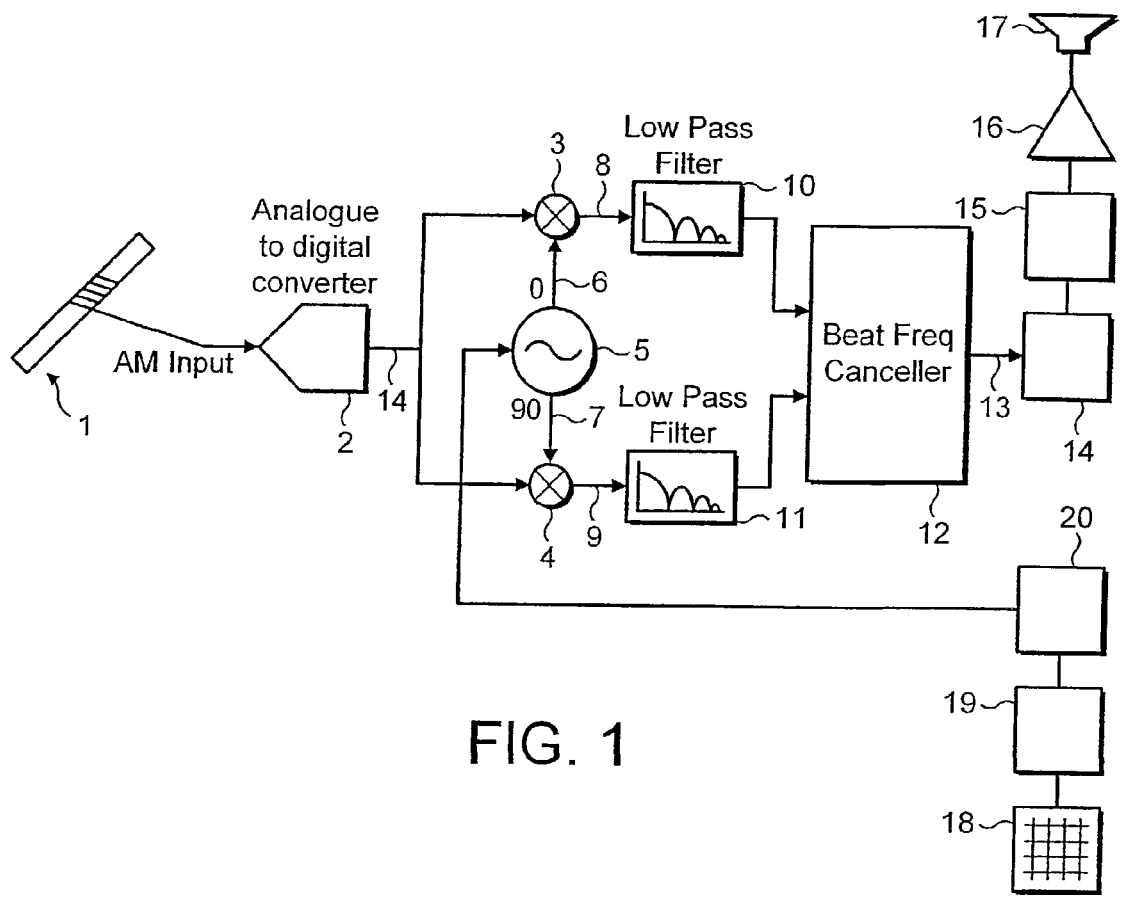
FIG. 1 is a schematic diagram of a radio receiver and associated components.

FIG. 1 is a schematic diagram of a radio receiver together with components associated with the radio receiver for controlling which frequency it is to receive and for providing its output to an audio source such as a loudspeaker. The radio receiver in this example is suitable for use as an amplitude modulation (AM) receiver for a domestic hi-fi.

The receiver includes an antenna 1 which receives an amplitude modulated radio frequency (RF) signal. The output of the antenna is passed to the input of A-to-D converter 2 which converts the analogue radio frequency signal from the antenna to the digital domain. The A-to-D converter is a single-bit A-to-D converter which periodically samples its input and outputs a single binary digit representing the level of the input signal: if the level of the input signal is less than a threshold then a binary 0 is output, and if the level of the input signal is greater than a threshold then a binary 1 is output. In the system of FIG. 1 A-to-D converter 2, to which the received signal at radio frequency is applied, is a $1^{st}$ order sigma-delta modulator. The sampling rate of the A-to-D converter is selected so that it over-samples the radio frequency carrier component of the received signal. In this example the sampling rate is 12 MHz. It is convenient to arrange for the sampling rate to be greater than twice the maximum radio frequency to be received by the receiver, as the same sampling rate can then be used for all reception. Alternatively, the sampling frequency may be altered depending on the frequency that is to be received. The sigma-delta modulator performs 1-bit sampling of the received signal, and thus produces an over-sampled digital bit-stream at 14, which retains information representing the received AM RF spectrum.

The radio frequency signal may be amplified and/or filtered between the antenna 1 and the A-to-D converter 2. However, it is preferable to minimise the number of components between the antenna and the A-to-D converter, since discrete RF components add to the complexity, cost and manufacturing difficulty of the receiver. If the antenna 1 and the A-to-D converter 2 are sufficiently sensitive then the antenna may be connected directly to the input of the A-to-D converter.

The output of the A-to-D converter is split and fed to two mixers 3, 4, which may be implemented as exclusive-OR gates.

A 1-bit local oscillator 5 generates a bit-stream signal at 6, whose output switches between 0 and 1 at the radio frequency at which it is desired to receive. The same signal as at 6 but phase shifted by 90° is generated at 7 by the oscillator 5. The signal at 6 is an in-phase (I) or 0° signal and the signal at 7 is a quadrature (Q) or 90° signal. The 0° signal at 6 is fed to the second input of mixer 3 where it is mixed with the output of A-to-D converter 2 to generate a signal at 8. The 90° signal at 7 is fed to the second input of mixer 4 where it is mixed with the output of A-to-D converter 2 to generate a signal at 9.

The mixers 3, 4 each combine their respective inputs to generate the signals at 8 and 9 in the form of digital bit-streams. The bit-stream outputs of the mixers 3 and 4 are fed to respective low pass filters 10, 11, where they are decimated and low pass filtered.

The filters 10, 11 may be implemented as $3^{rd}$ order CIC (cascaded integrator comb) filters. The CIC filters may be implemented in software or hardware. A preferred solution is to implement the high rate half of the filter in digital hardware, and to process the decimated outputs in software at an audio sample rate such as 44.1 kHz.

Figure 2:
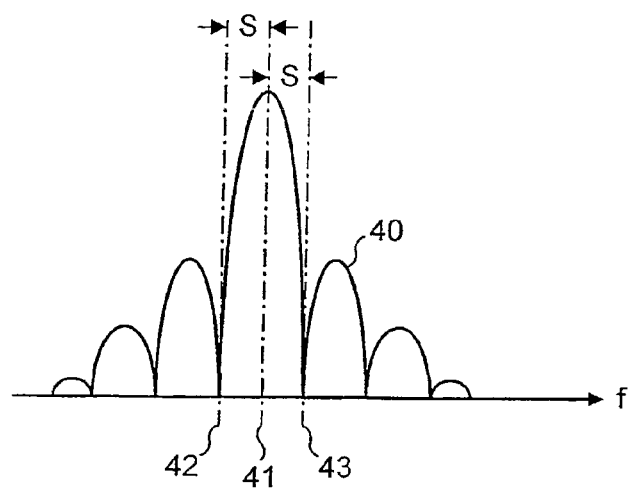
FIG. 2 illustrates the operation of filters of the receiver of FIG. 1.

The CIC filters are each set to decimate by 1360, i.e. from 12 MHz to approx. 8.820 kHz, which is approximately the channel spacing of the AM spectrum in the UK. This has the advantage of placing a sharp null at or near the centre of adjacent channels to attenuate their effect. This is illustrated in FIG. 2. Curve 40 shows the response of the filters against frequency, with the filter centred on a channel whose frequency is illustrated at 41. Adjacent channels at 42 and 43, spaced from channel 41 by a frequency spacing S, are sharply attenuated because they lie in nulls of the filter. The nulls are spaced approximately 2S apart. In jurisdictions where the standard channel spacing is different, the decimation ratio is again preferably set so that adjacent channels are sharply attenuated by the filter. The filter gives over 40 dB attenuation to signals over 9 kHz away.

The decimation rate is set to be one-fifth of the audio sample rate of 44.1 kHz, and in order for the audio processing to be compatible with the rest of the system, the AM data needs to be interpolated up by five times. This has the added benefit that it will attenuate the image frequencies at the lower sample rate by about 5 times.

Audio processing software can then low pass filter the AM signal at the 44.1 kHz rate with a corner frequency around 3.5 kHz. The software may also implement a beat cancellation function as described below.

Because in practice the local oscillator 5 cannot be perfectly set to the same frequency and phase as the signal that is received, a difference or beat frequency will be present in the received signal after mixing. The beat frequency is likely to be relatively low, in the range of the audio frequencies that are to be received, and thus in effect modulated on to the base-band audio. If it were not removed this frequency would cause an audible hum at the beat frequency. The beat frequency tone cannot be simply filtered out as the audio is modulated at around this rate.

Therefore, the outputs of filters 10, 11 are fed to beat frequency canceller 12. Beat frequency canceller 12 operates to cancel out the beat frequency between the signals from filters 10 and 11 to generate a receiver output signal at 13.

Because of the quadrature nature of the local oscillator outputs at 6 and 7 the beat tones in the signals at 10 and 11 have identical frequency, but a quadrature phase relationship. Beat frequency canceller (BFC) 12 implements an algorithm to remove the beat frequency by evaluating a trigonometrical relationship between the beat frequency of the Q and I channels.

The signals at I (the in-phase signal) and Q (the quadrature signal) can be described as follows:

$$I = A \cdot \mathrm{Sin}(\theta_b)$$

$$Q = A \cdot \mathrm{Cos}(\theta_b)$$

where A is the instantaneous value of the audio component and $\theta_b$ is the phase angle of the beat frequency. From the identity:

$$\mathrm{Tan}(\theta) = \frac{\mathrm{Sin}(\theta)}{\mathrm{Cos}(\theta)}$$

the tangent of the beat frequency angle can be calculated at any instant, allowing the audio component A to be cancelled when $\theta_b$ is in the first quadrant. Since:

$$|\mathrm{Sin}(\alpha)| = |\mathrm{Sin}(-\alpha)|$$

and $$|\mathrm{Cos}(\alpha)| = |\mathrm{Cos}(-\alpha)|$$

the tangent of the beat frequency can be generally evaluated by:

$$\mathrm{Tan}(\theta_b) = \frac{|A \cdot \mathrm{Sin}(\theta_b)|}{|A \cdot \mathrm{Cos}(\theta_b)|}$$

In order to avoid very large results, the denominator should be selected to be larger than the respective numerator to ensure that the result is a number between 0 and 1. This can be achieved by swapping the numerator and denominator depending upon their respective values. The swapping procedure is mathematically valid since:

$$\mathrm{Tan}(\theta_b) = T_\theta = \frac{|I|}{|Q|} \ldots (Q > I)$$

$$\mathrm{Tan}(\theta_b) = T_\theta = \frac{|Q|}{|I|} \ldots (I > Q)$$

Thus the beat frequency can be calculated in all four quadrants without any alteration to the mathematical principle. The arctangent can then be calculated giving the raw angle of the beat frequency. Given that the beat frequency is sinusoidal, the instantaneous value of the beat can be found. Form this a correction tone $P_\theta$ can be generated by:

$$P_\theta = \frac{1}{\mathrm{Cos}[\mathrm{Tan}^{-1}(T_\theta)]}$$

which can be multiplied by the I or Q signal to cancel the beat tone.

Therefore, the following algorithm can be implemented in the beat frequency canceller 12 to cancel out the beat frequency:

1. Read I and Q signals.
2. Calculate moduli of I and Q signals
3. If modulus of I is greater than modulus of Q then let $T_\theta$ equal modulus of Q divided by modulus of I, otherwise let $T_\theta$ equal modulus of I divided by modulus of Q
4. Evaluate correction tone $P_\theta$ for calculated $T_\theta$
5. Evaluate output signal by multiplying $P_\theta$ by I or Q signal In step 4 a look-up table may be used to determine the correction tone. In step 5 it is preferred that the larger of I and Q is multiplied by the correction tone.

In the beat frequency canceller 12 the software reads the two partially filtered signals from the digital hardware by which the high speed filtering of blocks 10 and 11 is performed and completes the filtering operation. It then applies the I and Q signals to the beat frequency cancellation algorithm. After finding the moduli of I and Q, and performing the appropriate division, the software then uses a lookup table to calculate the beat frequency correction data (i.e. reciprocal of the cosine of the arctangent of the ratio). The correction factor is then multiplied by either I or Q (which ever is the greater) to give audio output.

The BFC algorithm described above is based on an assumption that the beat frequency is sinusoidal. It is desirable for the beat frequency waveform to be as sinusoidal as possible, to minimise the formation of additional harmonic products. Because the downconversion is performed at 1-bit resolution—effectively square wave—harmonics may occur. The harmonic content of a square wave consists of linearly attenuated odd harmonics, i.e. $\frac{1}{3}^{rd}$ of third harmonic, $\frac{1}{5}^{th}$ of the $5^{th}$ harmonic, etc. The product of two of these is odd harmonics but at inverse square amplitudes, i.e. 3rd harmonic at $\frac{1}{9}^{th}$ amplitude. The resultant signal has the form of a triangle-wave. The BFC algorithm then actually 'generates' a waveform at 4 times the beat frequency on top of the audio because of the disparity between the I and Q waveforms and a sine-wave. In reality, both waveforms are not square waves at the RF frequency. The off-air received RF input is noise shaped and over-sampled and the local oscillator has some noise shaping too. If necessary, the shape of the waveform produced by the local oscillator may be improved by applying over-sampling and/or noise shaping techniques to the local oscillator.

By digitising the received radio frequency signal itself, i.e. before any downconversion has been performed, the receiver of FIG. 1 avoids the need for many discrete analogue components that are required in traditional receiver designs, for example in their RF and IF sections and conversion sections.

The filtering and/or the beat cancellation sections of the receiver of FIG. 1 may be used advantageously in a receiver that does not digitise at RF, but in which digitisation is performed at IF or baseband.

The output at 13 of beat canceller 12 is a fully demodulated digitised signal at audio frequency. That signal is passed to audio unit 14 which can process the signal as required, for example to alter its volume or tone or to perform frequency equalisation. The signal is then converted to the analogue domain by D-to-A converter 15, amplified by amplifier 16 and passed to loudspeaker 17. A user input device 18 such as a keypad allows a user to enter the frequency that is to be received. The keypad input is interpreted by keypad port 19 and passed to output port 20 which sends a signal at 21 to control the local oscillator 5 to oscillate at the frequency entered by the user. Loudspeaker 17 may be replaced by headphones, or the output signal may be passed to a recorder.

The amplifier 16 may be a class D amplifier and it may receive a class D input.

A number of the units shown in FIG. 1 are preferably provided on a common integrated circuit. In one preferred embodiment, the units 12, 14, 15, 19, 20 and the low rate halves of filters 10 and 11 are preferably implemented on a common integrated circuit. That circuit may comprise a digital processor capable of executing software to perform the functions of units 10, 11, 14 and 15 and input and output ports to perform the functions of units 19 and 20 and to link it to the high rate halves of filters 10 and 11 and to amplifier 16. If desired, the entire system of FIG. 1, with the exception of the loudspeaker 17, the antenna 1 and the input device 18 could be formed on a single integrated circuit.

The applicant draws attention to the fact that the present invention may include any feature or combination of features disclosed herein either implicitly or explicitly or any generalisation thereof, without limitation to the scope of any of the present claims. In view of the foregoing description it will be evident to a person skilled in the art that various modifications may be made within the scope of the invention.

The invention claimed is:

1. A radio receiver, comprising:
an antenna configured to receive a radio frequency signal amplitude modulated with an audio frequency signal;
a digitiser configured to sample the radio frequency signal and to generate a digital reception signal representative of the amplitude of the radio frequency signal;
a demodulator configured to demodulate the digital reception signal to generate a representation of the audio frequency signal, wherein the demodulator comprises a local oscillator configured to generate a first local oscillator signal at a reception frequency of the receiver, a first mixer configured to mix the first local oscillator signal with the digital reception signal to form a first demodulated signal, and a second mixer configured to mix a second local oscillator signal with the digital reception signal to form a second demodulated signal, wherein the second local oscillator signal is at the reception frequency of the receiver and having a quadrature phase relationship with the first local oscillator signal; and
a beat cancellation device configured to form a beat-cancelled signal by processing the first demodulated signal and/or the second demodulated signal to at least partially cancel from the first demodulated signal and/or the second demodulated signal a beat frequency resulting from the mixing of the local oscillator signals with the digital reception signal,
wherein the radio receiver is configured for operation in a radio system in which a plurality of radio channels are transmitted at frequencies spaced apart by a predetermined channel spacing, and the demodulator further comprises a filter configured to filter the first demodulated signal, the filter having a peak response in the region of the reception frequency of the receiver and having nulls in its response in a region of frequencies spaced apart from the reception frequency of the receiver by a channel spacing.

2. A radio receiver as claimed in claim 1, wherein the digital reception signal is a single-bit signal.

3. A radio receiver as claimed in claim 2, wherein the digitiser comprises a single-bit digitiser.

4. A radio receiver as claimed in claim 2, wherein the digitiser comprises a sigma-delta modulator.

5. A radio receiver as claimed in claim 1, wherein the first local oscillator signal is a single-bit signal.

6. A radio receiver as claimed in claim 5, wherein the first mixer comprises an exclusive OR gate having two inputs and configured to receive the digital reception signal at one of its inputs and the first local oscillator signal at the other of its inputs.

7. A radio receiver as claimed in claim 1, further comprising a user input device for input of a user reception frequency, and a local oscillator controller responsive to the user input device for controlling the local oscillator to generate the first local oscillator signal at the user reception frequency.

8. A radio receiver as claimed in claim 1, wherein the second local oscillator signal is generated by the local oscillator.

9. A radio receiver as claimed in claim 1, wherein the beat cancellation device is configured to repeatedly perform:
determining a modulus of the first demodulated signal;
determining a modulus of the second demodulated signal;
comparing the modulus of the first demodulated signal with the modulus of the second demodulated signal;
determining a quotient by dividing the greater of the moduli of the first demodulated signal and the second demodulated signal by the lesser of the moduli of the first demodulated signal and the second demodulated signal;

determining a cancellation factor having the value of the reciprocal of the cosine of the arctangent of the quotient; and forming the beat-cancelled signal by multiplying one of the first and second demodulated signals by the cancellation factor.

10. A radio receiver as claimed in claim 9, wherein said one of the first and second demodulated signals multiplied by the cancellation factor is the one of the first and second demodulated signals having the greater magnitude.

11. A radio receiver as claimed in claim 9, wherein determining the cancellation factor having the value of the reciprocal of the cosine of the arctangent of the quotient comprises retrieving from a stored look-up table the cancellation factor corresponding to the determined quotient.

12. A radio receiver as claimed in claim 1, wherein the beat cancellation device comprises a digital processor configured to form the beat-cancelled signal.

13. A radio receiver as claimed in claim 1, further comprising a user input device configured for user selection of one of a plurality of reception frequencies spaced apart by the channel spacing.

14. A radio receiver as claimed in claim 1, wherein the digitiser is configured to periodically sample the radio frequency signal at more than twice the reception frequency of the receiver.

15. A radio receiver for operation in a radio system in which a plurality of radio channels are transmitted at frequencies spaced apart by a predetermined channel spacing, the receiver comprising:

an antenna for receiving a radio frequency signal;

a demodulator for demodulating a signal derived from the radio frequency signal to form a demodulated signal; and a filter for filtering the demodulated signal, the filter having a peak response in a region of a reception frequency and having nulls in its response in a region of frequencies spaced apart from the reception frequency by the predetermined channel spacing, and the filter being configured to decimate the demodulated signal in hardware, and being configured to filter the decimated signal in software at an audio sample rate.

16. A radio receiver as claimed in claim 15, wherein the radio frequency signal is amplitude modulated with an audio frequency signal.

17. A radio receiver as claimed in claim 15, further comprising a digitiser for periodically sampling the radio frequency signal and generating as a digital reception signal representative of the amplitude of the radio frequency signal.

18. A radio receiver as claimed in claim 17, wherein the digitiser comprises a single-bit digitiser.

19. A radio receiver as claimed in claim 17, wherein the digitiser comprises a sigma-delta modulator.

20. A radio receiver as claimed in claim 17, wherein the demodulator comprises a local oscillator configured to generate a first local oscillator signal at the reception frequency of the receiver, and a mixer configured to mix the first local oscillator signal with the digital reception signal to form a first demodulated signal.

21. A radio receiver as claimed in claim 20, wherein the first local oscillator signal is a single-bit signal.

22. A radio receiver as claimed in claim 21, wherein the mixer comprises an exclusive OR gate having two inputs and configured to receive the digital reception signal at one of its inputs and the first local oscillator signal at the other of its inputs.

23. A radio receiver as claimed in claim 20, further comprising a user input device for input of a user reception frequency, and a local oscillator controller responsive to the user input device and configured to control the local oscillator to generate the first local oscillator signal at the user reception frequency.

24. A radio receiver as claimed in claim 23, wherein the user input device is configured to receive an input selecting one of the plurality of radio channels and the local oscillator controller is configured to, on the basis of the selected channel, cause the local oscillator to generate the first local oscillator signal at one of the frequencies spaced apart by the predetermined channel spacing.

25. A radio receiver as claimed in claim 15, wherein the attenuation of the filter at frequencies spaced above and below the reception frequency by the predetermined channel spacing is more than $10^8$ times the attenuation of the filter at the reception frequency.

26. A radio receiver as claimed in claim 15, wherein the attenuation of the filter at frequencies spaced above and below the reception frequency by the predetermined channel spacing is more than $10^{11}$ times the attenuation of the filter at the reception frequency.

27. A radio receiver as claimed in claim 15, wherein the predetermined channel spacing is 8.820 kHz.

28. A radio receiver as claimed in claim 15, wherein the filter comprises a cascaded integrator comb filter.

29. A radio receiver as claimed in claim 15, wherein the filter is a third-order filter.

30. A radio receiver as claimed in claim 15, wherein the audio sample rate is 44.1 kHz.

31. A method for cancelling a beat frequency in a radio receiver configured to receive a radio signal, forming a first demodulated signal by mixing a signal derived from the radio signal with a first local oscillator signal, and forming a second demodulated signal by mixing the signal derived from the radio signal with a second local oscillator signal having a quadrature relationship with the first local oscillator signal, the method comprising repeatedly performing:

determining the modulus of the first demodulated signal;

determining the modulus of the second demodulated signal;

comparing the modulus of the first demodulated signal with the modulus of the second demodulated signal;

determining a quotient by dividing the greater of the moduli of the first demodulated signal and the second demodulated signal by the lesser of the moduli of the first demodulated signal and the second demodulated signal;

determining a cancellation factor having the value of the reciprocal of the cosine of the arctangent of the quotient; and forming a beat-cancelled signal by multiplying one of the first and second demodulated signals by the cancellation factor.

32. A method as claimed in claim 31, wherein determining the cancellation factor comprises retrieving from a stored look-up table the cancellation factor corresponding to the quotient.

33. A method as claimed in claim 31, wherein the signal derived from the radio signal is formed at a sampling frequency greater than a reception frequency of the received radio signal.

34. A method as claimed in claim 31, wherein the signal derived from the radio signal is noise-shaped.

35. A method as claimed in claim 31, wherein the first and second demodulated signals are radio frequency signals.

36. A method as claimed in claim 31, wherein the first and second demodulated signals are intermediate frequency signals.

37. A method as claimed in claim 31, wherein the first and second local oscillator signals are single-bit signals and the method further comprises forming first and second single-bit demodulation signals by mixing the signal derived from the radio signal with the first and second local oscillator signals respectively, and decimating the first and second single-bit demodulation signals to form the first and second demodulated signals.

38. A method as claimed in claim 31, wherein the first and second demodulated signals are eight-bit signals.

39. A method as claimed in claim 31, wherein said one of the first and second demodulated signals multiplied by the cancellation factor is the one of the first and second demodulated signals having the greater magnitude.

40. A method as claimed in claim 31, wherein the method is performed by a beat cancellation device and wherein forming the beat-cancelled signal by multiplying one of the first and second demodulated signals by the cancellation factor comprises a digital processor of the beat cancellation device forming the beat-cancelled signal.

* * * * *